United States Patent [19]

Rosencher et al.

[11] Patent Number: 5,869,844
[45] Date of Patent: Feb. 9, 1999

[54] DEVICE FOR THE DETECTION OF OPTICAL RADIATIONS

[75] Inventors: Emmanuel Rosencher, Bagneux; Philippe Bois, Cesson, both of France

[73] Assignee: Thomson-CSF, Puteaux, France

[21] Appl. No.: 373,889

[22] Filed: Jan. 17, 1995

Related U.S. Application Data

[63] Continuation of Ser. No. 54,839, Apr. 30, 1993, abandoned, which is a continuation of Ser. No. 543,785, Jul. 24, 1990, abandoned.

[30] Foreign Application Priority Data

Dec. 6, 1988 [FR] France ................................. 88 15959

[51] Int. Cl.⁶ ...................... H01L 31/0304; H01L 31/101
[52] U.S. Cl. ............................ 257/21; 359/248; 359/278; 359/1
[58] Field of Search ........................ 257/21, 14; 359/248, 359/278

[56] References Cited

U.S. PATENT DOCUMENTS

| | | | |
|---|---|---|---|
| 4,447,746 | 5/1984 | Fang et al. | 257/290 |
| 4,590,507 | 5/1986 | Capasso et al. | 357/4 SL |
| 4,745,452 | 5/1988 | Sollner | 372/43 |

FOREIGN PATENT DOCUMENTS

| | | |
|---|---|---|
| 0155802 | 9/1985 | European Pat. Off. . |
| 155802 | 9/1985 | European Pat. Off. . |
| 0316 909 | 5/1989 | European Pat. Off. . |

OTHER PUBLICATIONS

Electronics Letters, vol. 23, No. 20, 24 Sep. 1987, K. Wakita et al.: "GaInAs/InP wave–guide multiple–quantum–well optical modulator with 9dB on/off ratio", pp. 1067–1069.

Applied Physics Letters, vol. 47, No. 12, 15 Dec. 1985, American Institute of Physics, K.W. Goossen et al: "Grating enhanced quantum well detector", pp. 1257–1259.

Applied Physics Letters, vol. 45, No. 11, 1 Dec. 1984, American Institute of Physics, F. capasso et al.: "Peseudo–quaternary GaInAsP semiconductors: A new Ga0.47In0.53As/InP graded gap superlattice and its applications to avalanche photodiodes", pp. 1193–1195.

IEEE Journal of Quantum Electronics, vol. QE–19, No. 5, May 1983, IEEE, M.K. Gurnick et al.: "Synthetic nonlinear semiconductors", pp. 791–794.

Applied Physics Letters, vol. 51, No. 25, 21 Dec. 1987, American Institute of Physics, J. Khurgin: "Second–order susceptibility of asymmetric coupled quantum well structures", pp. 2100–2102.

"Principles of the Theory of Solids" by J.M. Ziman, pp. 280–281.

"Quantum Semiconductor Structures" Claude Weisbuch and Borge Vinter, pp. 86–87.

"Observation of nonlinear optical rectification at 10.6 μm in compositionally asymmetrical AlGaAs multiquantum wells" by E. Rosencher et al, pp. 1597–1599.

"Electronic properties of two–dimensional systems" by Tsuneya Ando, pp. 450–451.

Primary Examiner—John Guay
Attorney, Agent, or Firm—Oblon, Spivak, McClelland, Maier & Neustadt, P.C.

[57] ABSTRACT

Device for the detection and processing of optical radiations, comprising at least one quantum well having asymmetric composition, said well consisting of a stack of layers of materials having differing gaps.

5 Claims, 5 Drawing Sheets

DEVICE FOR THE DETECTION OF OPTICAL RADIATIONS

This application is a Continuation of application Ser. No. 08/054,839, filed on Apr. 30, 1993, now abandoned, which is a Continuation of application Ser. No. 07/543,785, filed on Jul. 24, 1990, now abandoned.

BACKGROUND OF THE INVENTION

1. Field of the Invention

The invention relates to a device for the detection and processing of optical radiations.

2. Discussion of the Invention

Long-wavelength optical detectors (greater than or equal to 5 micrometres) fall into two large main groups of devices:

Photoelectric effect semiconductor detectors.

Photothermic detectors.

In the first case, these detectors operate only at low temperature. In fact, the principle of operation of these devices is based on the generation of free carriers by optical transition between 2 energy levels $E_1$ and $E_2$. Depending upon the type of application:

The energy level $E_1$ is the trap level and $E_2$ the conduction band for the extrinsic photoconductors.

The energy level $E_1$ is the valence band, and $E_2$ the conduction band for the intrinsic photoconductors, photovoltaics etc . . .

$(E_2-E_1)$ is the barrier height in a Schottky detector.

If an electromagnetic wave permits a transition $(E_2-E_1)$ of low energy value (110 meV, for example), the phonons at ambient temperature will be of sufficiently high energy (25 mev) and sufficiently numerous to cause this transition. In other words, the dark current is very large in such a device at ambient temperature and the detectivity of the photodetector (like its impedance) is extremely low ($D^{*-}10^6$ cm. $\sqrt{Hz}/W$)

In the second case, that is to say in photo-thermic detectors, the increase in the temperature due to the absorption of the electromagnetic wave leads to a variation of the dielectric constant of a pyroelectric material. In contrast to the first group of devices (photoelectric effect semiconductor detectors), these detectors operate at ambient temperature. As optical transitions between associated levels are not involved, the electrical conductivity of these materials does not change, and the impedance of the capacitive structures remains very large, permitting high amplifications.

SUMMARY OF THE INVENTION

The subject of the invention is detection structures utilizing transitions between associated levels in asymmetric quantum wells. More generally, the invention relates to optical processing devices exhibiting the following advantages:

1. of operating readily at ambient temperature or slightly cooled, at high wavelengths (for example, more than 3 μm).
2. for detectors, of providing a very high impedance, even at ambient temperature, which permits a high amplification and a utilization as detector at ambient temperature.
3. of all being capable of being manufactured by the technology of semiconductors and thus exhibiting a possibility of integration into a semiconductor system.

Accordingly, the subject of the invention is a device for the detection and processing of optical radiations, characterized in that it comprises a non-linear crystal comprising at least one quantum well of asymmetric composition, said well consisting of a stack of layers of materials having differing gaps.

The subject of the invention is also a process for the construction of a detection and processing device as described previously, characterized in that the various layers of materials constituting the stacks of asymmetric quantum wells are constructed by epitaxy.

The various subjects and features of the invention will appear more clearly in the description which will follow, which is given by way of example with reference to the accompanying figures, in which.

Figure 1:
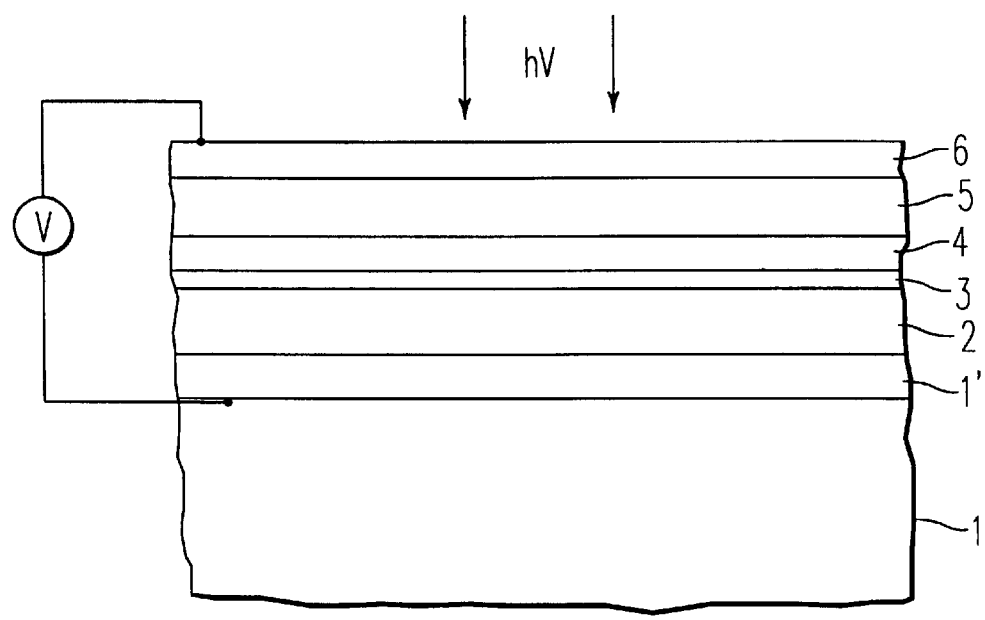
FIG. 1 represents an example of structure according to the invention.
Figure 2:
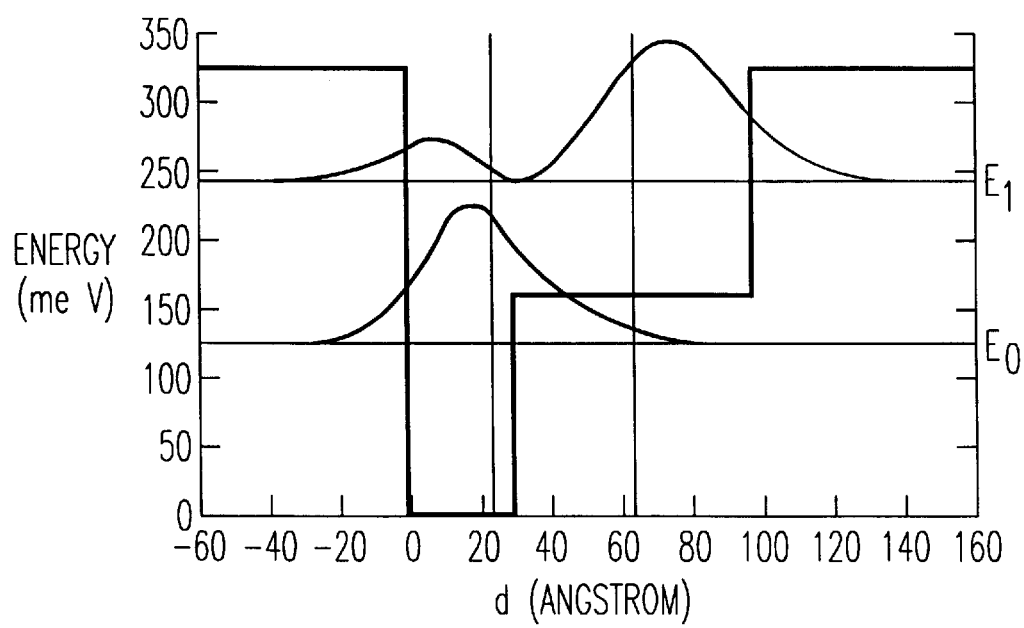
FIG. 2 represents an energy diagram according to the invention.

FIG. 1 represents a simplified structure of a detector according to the invention, and FIG. 2 an energy diagram of this detector. This detector comprises, on a substrate 1, two layers of different semiconductor materials 3 and 4 clamped between two layers 2 and 5 of one and the same semiconductor material. The materials of these various layers are selected in such a manner that the layers 3 and 4 constitute an asymmetric quantum well as represented in FIG. 2. For this, the materials of the layers 3 and 4 possess differing conduction potentials.

By way of example, the materials selected may be the following:

for the substrate

1: GaAs doped with impurities or semi-insulating GaAs with an n+-doped buffer layer 1' of GaAs;

for the layer 2: $Al_xGa_{1-x}As$ with x within the range between 0 and 1;

for the layer 3: GaAs;

for the layer 4: $Al_yGa_{1-y}As$ with y within the range between 0 and x;

for the layer 5: $Al_xGa_{1-x}As$ with x within the range between 0 and 1 (same x as for the layer 2;

for the layer 6: GaAs doped with $n^+$-type impurity.

Contacts are constructed on the layers 1 and 6 in such a manner as to connect a device V for measurement of charge potential.

It should be noted that other heterostructures may be envisaged, such as heterostructures based on Si/SiGe or InGaAs/InAlAs, etc . . .

The essential matter is to construct a device incorporating an asymmetric quantum well as represented in FIG. 2.

FIG. 2 shows the position of the ground state $E_0$ and the excited state $E_1$, as well as the probabilities of presence of the electrons in each one of the states. The composition and the width of the quantum wells have been optimized in such a manner that $E_1-E_0$ corresponds to the wavelength which it is desired to detect. The bary-centre of the charges in each one of the states is also indicated. Under illumination, the transition between the two states will cause the appearance of an electrically detectable dipole, between the fixed charges of the deepest well and the charges in the state $E_1$. This asymmetry will engender, in addition, phenomena of nonlinear optics such as optical rectification and heterodyning.

Figure 3:
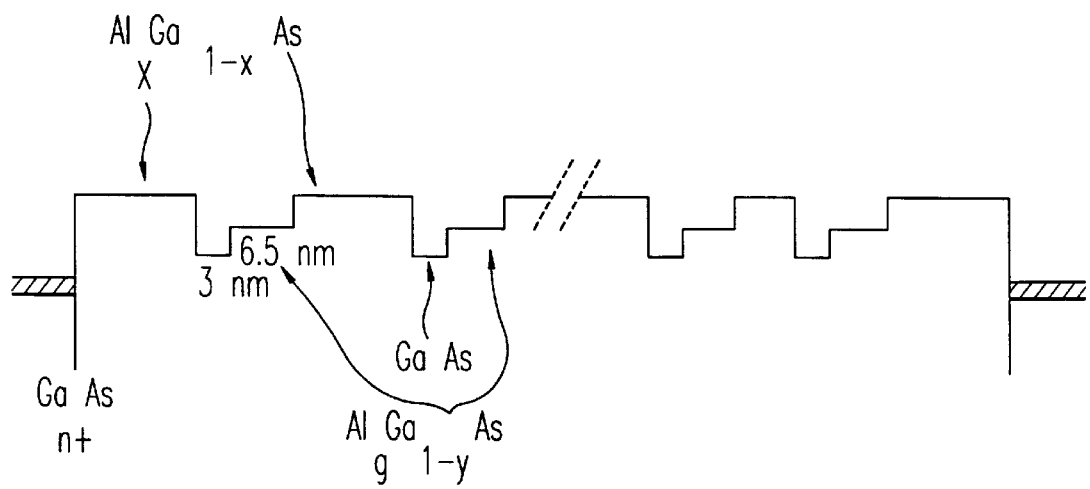
FIG. 3 represents a diagram of a stack of quantum wells according to the invention.

FIG. 3 represents a structure consisting of a stack of quantum wells of asymmetric compositions such as that of FIGS. 1 and 2.

By way of example, the layers of each quantum well, corresponding to the layers 3 and 4 of FIG. 1, have thicknesses of 3 nm and 6.5 nm for operation at 10.6 μm. The barrier layers flanking each well (2 and 5 in FIG. 1) have thicknesses of 30 nm.

The layer 3 can contain an electron density between a few $10^{17}$ per cm$^3$ and a few $10^{18}$ per cm$^3$ arising from a doping of the structure, for example from the doping of the layer 3 itself.

The compositional coefficients of the materials $Al_xGa_{1-x}As$ and $Al_yGa_{1-y}As$ have, in this illustrative embodiment, the following values:

x=0.4 y=0.2.

At ambient temperature, with a structure based on GaAs and AlGaAs, such as that described previously, if $E_1-E_0$ has the value of 120 mev the population ratio between the two states is $n_1/n_0=1\%$. The state $E_0$ is taken sufficiently deep for the total structure of FIG. 3 to be insulating.

The detection of a dipole may take place, according to the invention, by detection of the surface charge potential by means of the device V of FIG. 1.

The surface potential is due to two effects:

a pyroelectric effect resulting from a heating caused by the radiation to be detected;

an effect of optical rectification of the radiation to be detected.

As regards the pyroelectric effect, a quantum computation shows that, if a doping of the wells of the order of $10^{11}$ cm$^{-2}$ is taken, with a lifetime of 0.14 ps, the response of a capacitive diode having a thickness of 1 μm is 10 μV/W.cm$^{-2}$ at ambient temperature, it is readily detectable.

Figure 4:
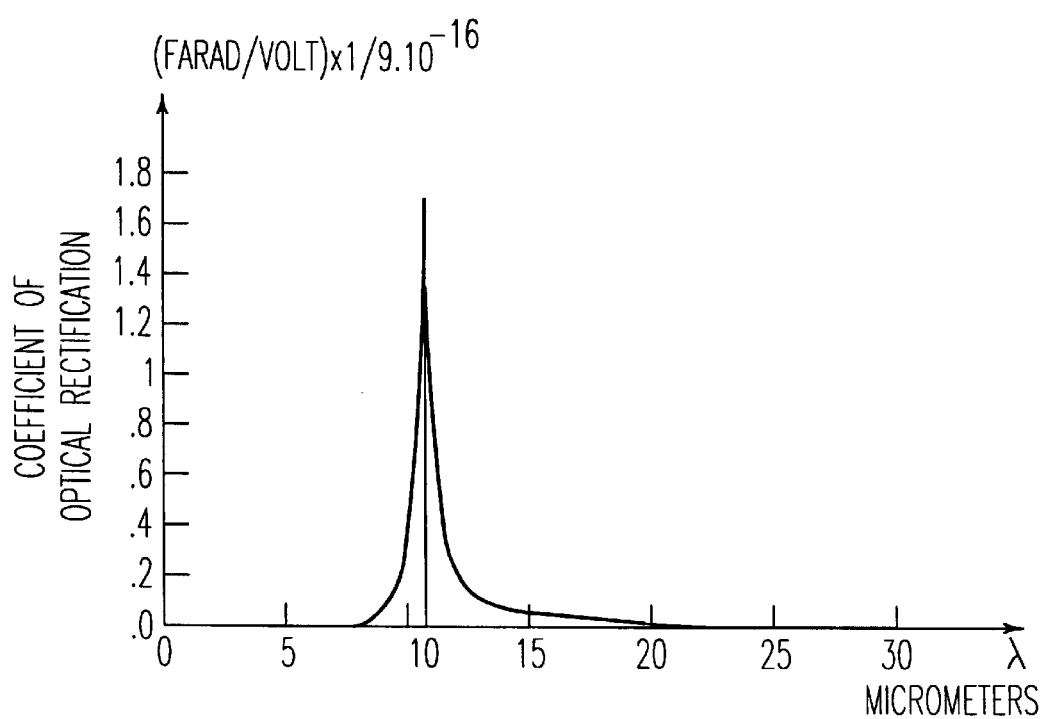
FIG. 4 represents a curve of variation of the coefficient of optical rectification as a function of the incident wavelength.

As regards the optical rectification effect, FIG. 4 represents the variation of the optical rectification coefficient of the detection medium (layers of the quantum wells) $D^{0=\omega-\omega}$ as a function of the incident wavelength (see the document "Quantum Electronics" (second edition) by AMNON YARIV published by John Wiley and Sons Inc., New York, chapter 16—Introduction to Nonlinear Optics—Second Harmonic Generation, pages 407 to 409). By way of example, for a wavelength of 10.6 micrometres, there is detected a potential of approximately 1.6 microvolts, per watt per square centimetre at the terminals of the capacitor. It is indeed found that there is resonance for $h\nu=E_1-E_0$.

We state once again that the detected signal comprises the detection of the pyroelectric, optical rectification and photocapacitive effects.

Figure 6:
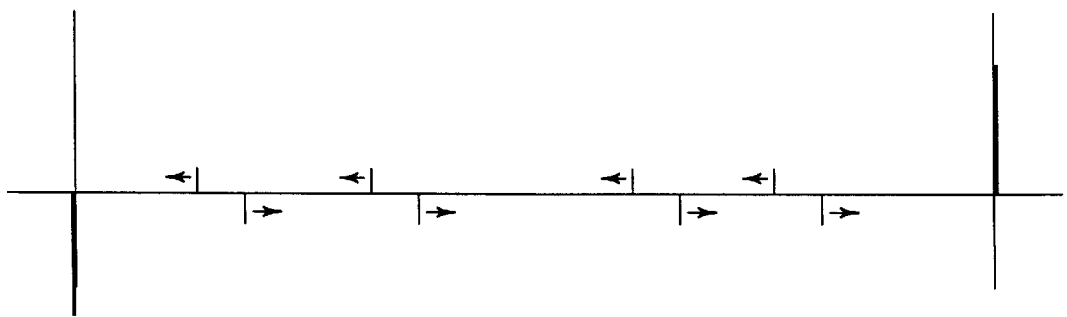
FIG. 6 represents a diagram of a stack of quantum wells showing the polarizability of the structure.

Moreover, the radiation received by the devices of the FIGS. 1 or 3 may induce a variation of effective index of the medium. In fact, the appearance of the dipoles will modify the static polarizability of the medium, as illustrated in FIG. 6. In this figure, the arrows designate the movements of the dipoles under the influence of an alternating electric field for the capacitive measurement of the dipoles. This polarizability will be capable of being detected readily in a Wheastone bridge or a tuned circuit incorporating inductors, resistors, capacitors.

In order to increase the sensitivity, it is possible to modulate the light by a mechanical or electro-optical modulator.

A detection device, the operation of which obtained by detection of a potential at the surface of the device is implemented according to the invention by a detection structure incorporating asymmetric quantum wells, is integrated at the source or at the gate of a field effect transistor.

Figure 5:
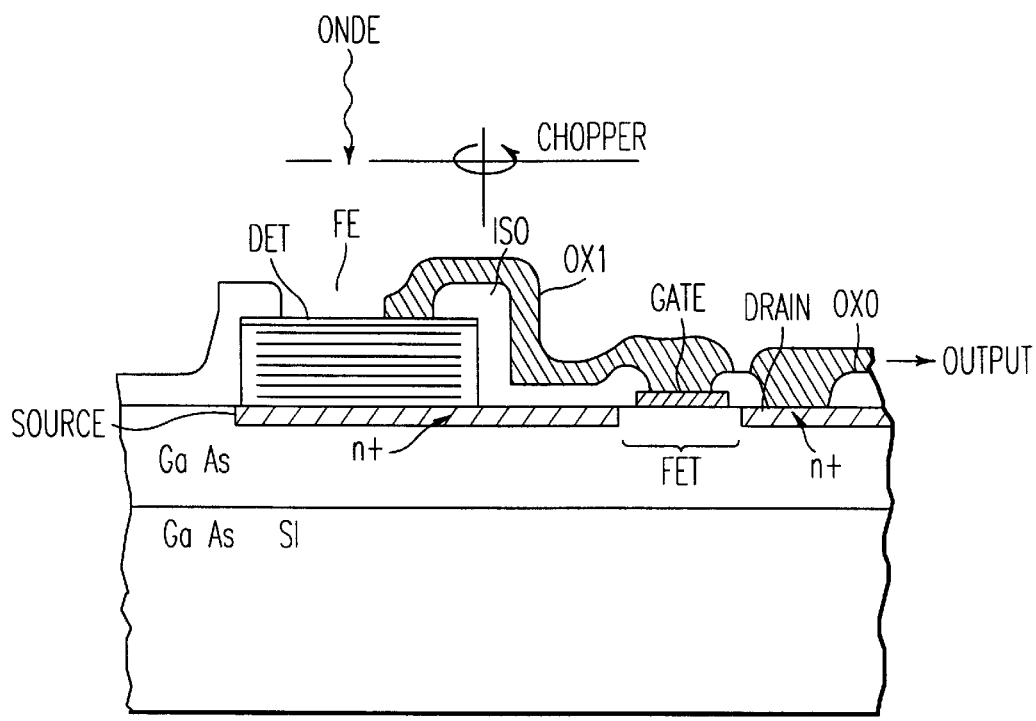
FIG. 5 represents an integrated structure of the device of FIG. 1 with a field effect transistor.

FIG. 5 represents such an integrated device, in which the detection device DET, consisting of a stack of asymmetric quantum wells, is integrated at the source of a field effect transistor.

According to FIG. 5, the structure according to the invention is constructed, by way of example, of gallium arsenide:

on a semi-insulating GaAs substrate, a layer of GaAs which is n-doped and comprises two n+-doped zones constituting the source and the drain;

a metallic layer constituting the gate of the transistor and situated between the two n+-doped zones;

the detection device DET consisting of a stack of asymmetric quantum wells and situated on the n+-doped zone of the source of the transistor;

a layer of insulator ISO permitting the insulation of the flanks of the detection device as well as of the connections of the transistor;

a metallic connection CX1 permitting the connection of the upper face of the device DET to the gate of the transistor;

a metallic connection CX0 connected to the drain of the transistor and supplying an output signal.

The upper face of the device DET possesses a window FE comprising neither insulator nor metallic connection and permitting a radiation to act on the device DET.

The radiation may be transmitted to the device DET by a mechanical or electrooptical modulation device as represented in FIG. 5.

Thus, the device DET permits the creation of a potential difference between the source and the gate. There is detected on the drain connection CX0 an output signal proportional to the intensity of radiation supplied to the device DET.

The device of the invention may likewise be applied to a device for optical detection by heterodyning.

Figure 7:
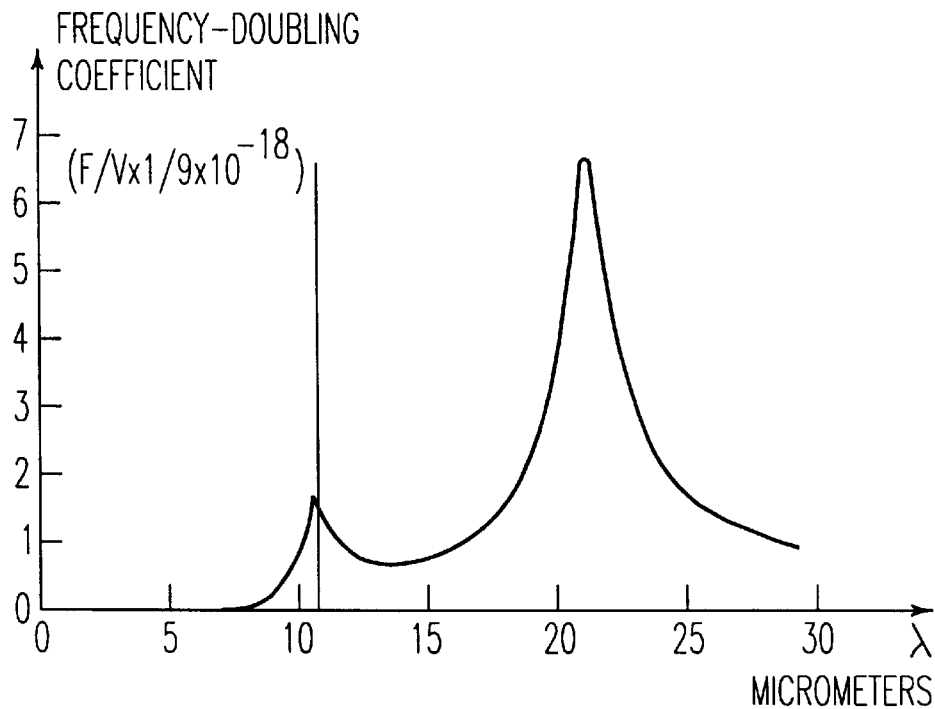
FIG. 7 represents a curve of variation of the frequency doubling coefficient.

As already indicated, the asymmetry of the wave functions of the various quantized states of the structure induces a very large optical nonlinearity coefficient $d^{2\omega=\omega+\omega}$ (see documents by AMNON YARIV referred to previously, as well as "Synthetic Nonlinear Semiconductors" by M. K. GURNICK et al., published in IEEE Journal of Quantum Electronics, No. 5 of May 1983 and "Electric field control of optical second harmonic generation in a quantum well" by L. TSANG, published in Applied Physics Letters 52 (9) of 29 Feb. 1988. FIG. 7 represents the computed values of the optical doubling coefficient of the structure $d^{2\omega=\omega+\omega}$ for the example treated in FIG. 1. For a wavelength of 10.6 μm, the nonlinear coefficient is 17,000 (1/9.10$^{-22}$ M K SA), as compared with 72 for pure GaAs (same unit). This permits the utilization of the asymmetric quantum multiwells for the heterodyne detection between the signal to be detected and a pump beam.

Figure 8:
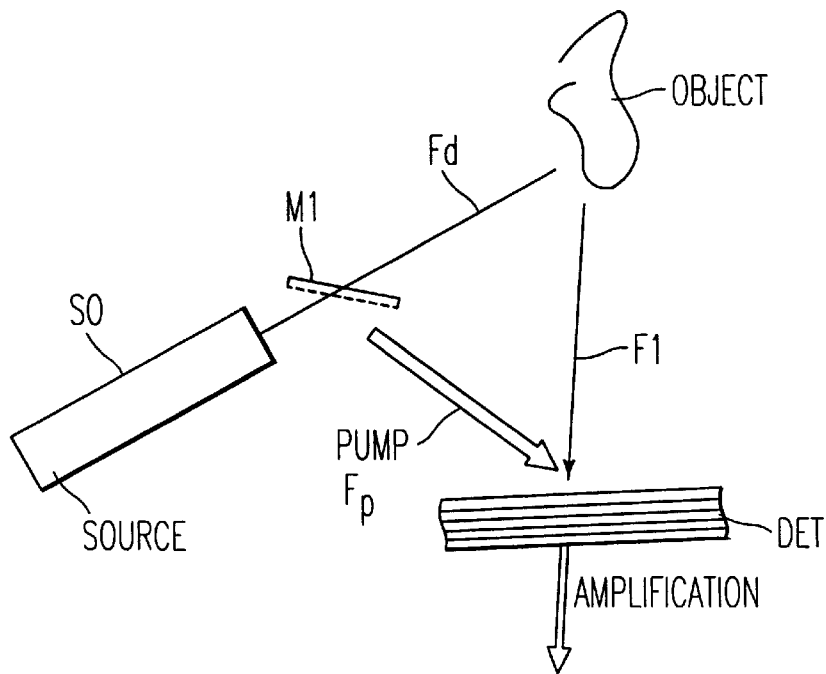
FIG. 8 represents a device for optical detection by heterodyning.

Thus, FIG. 8 represents a device permitting such a detection. This device comprises a laser source emitting a laser beam towards a semi-reflecting plate which retransmits, on the one hand, a detection beam Fd towards an object to be detected and, on the other hand, a pump beam Fp to the detection device DET consisting of a stack of quantum wells.

The device DET receives a beam F1 originating from the reflection of the beam Fd by the object to be detected. The beam F1 is amplified in the device DET by the pump beam Fp. An amplified beam is thus supplied by the device DET and is readily detectable.

As has been mentioned above, the invention is applicable to the detection of pyroelectric effects, of optical and photo-capacitive rectification.

Application of the invention to an electrooptical modulating device will be described with reference to FIG. 9.

Figure 9:
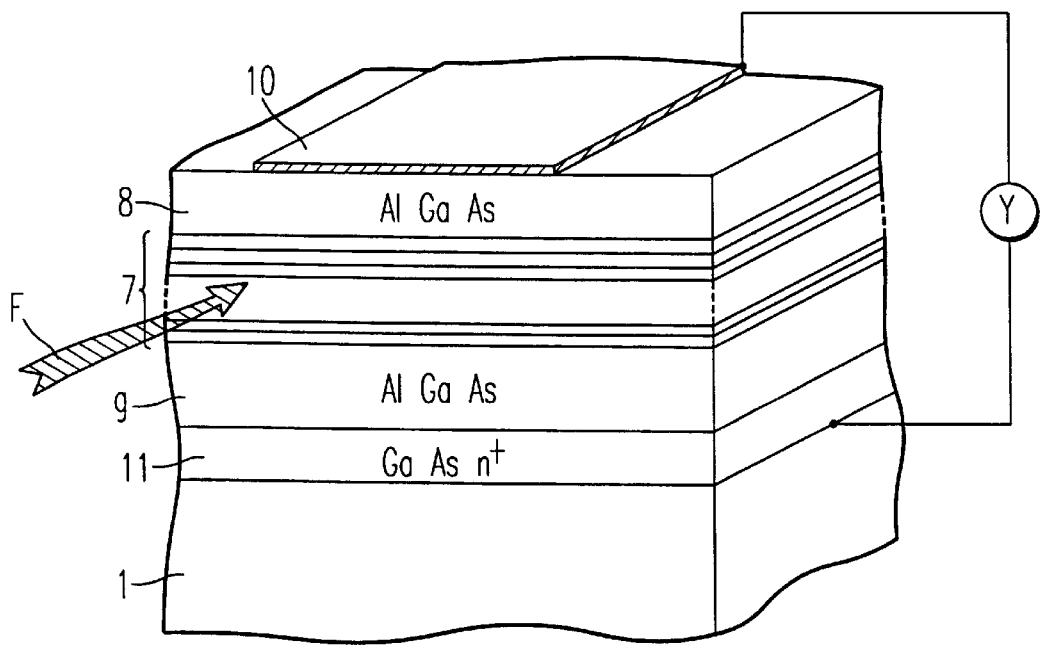
FIG. 9 represents an example of an electro-optical modulating device according to the invention.

The electrooptical modulating device of FIG. 9 comprises a layer of a nonlinear crystal 7 consisting of a stack of layers of materials having differing gaps so as to provide a stack of asymmetric wells (asymmetric quantum multi-wells) as described above and in particular as represented in FIG. 3. The layer of nonlinear crystal 7 is clamped between two layers of an optical guide material 8 and 9. These layers 8 and 9 are for example made of aluminium and gallium arsenide (AlGaAs). The complete structure is supported by a substrate 1 provided with a layer 11 of an $n^+$-doped semiconductor, such as GaAs, or of a conducting material acting as an electrode. An electrode 10 is provided on the optical guide layer 8. A voltage generator V is connected to the electrode 10 and to the layer 11 so as to apply an electric field to the structure.

In this way, a luminous flux F transmitted in the layer of nonlinear crystal 7 undergoes modulation under the effect of the applied electric field.

This modulation can be a phase modulation or a contrast modulation depending on:

the types of materials utilized by the layers of the stack of asymmetric wells of the nonlinear crystal 7, the doping of these layers, the wavelength to be modulated, the length of the device in the direction of travel of the wave to be modulated. In what preceded, the optical guide layers 8, 9 were regarded as being of AlGaAs, however they could be of any other material permitting optical guiding and quite clearly of a semiconductor material suited to the construction of the stack of asymmetric quantum wells.

By way of example, the stack of layer 7 can be constructed in the same way as was described in connection with FIG. 3.

Figure 10:
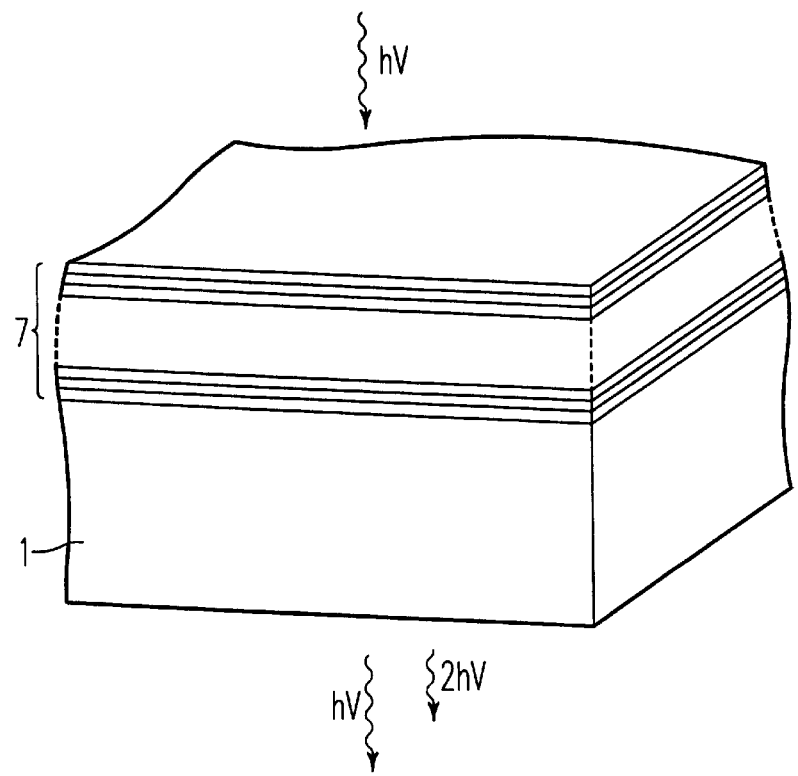
FIG. 10 represents an example of an optical frequency-doubling device according to the invention.

FIG. 10 represents an optical frequency-doubling device. It comprises a substrate 1 on which has been constructed a stack 7 of layers constituting a stack of asymmetric quantum wells as described in connection with FIG. 3. The stack 7 therefore constitutes a nonlinear crystal having asymmetric quantum wells.

A simple asymmetric quantum well receiving a light wave of frequency $h\nu$ gives rise to two light waves of frequencies $h\nu$ and $2h\nu$.

Under these conditions, the device of FIG. 10 operates as a frequency doubler and delivers, providing therefor a large number of asymmetric quantum wells, a wave of frequency $2h\nu$ having a significant intensity.

The substrate 1 is of a material which is transparent to the waves of frequencies $h\nu$ and $2h\nu$.

By way of illustrative embodiment, the stack 7 of layers is constructed in such a way that each quantum well of the quantum well stack has the following characteristics:

barrier layers=$Al_{0.4}Ga_{0.6}As$ of 30 nm thickness layers of quantum wells=GaAs=thickness 6 nm containing $5.10^{17}$ carriers per $cm^3$ due to a doping of the structure $Al_{0.1}Ga_{0.9}As$ thickness 4.5 nm.

The invention as described above therefore clearly relates to a type of optical detector or of optical processing device having in common the fact that the active part is a crystal constructed in the form of a stack of asymmetric quantum wells.

Such devices have the advantage of functioning at large wavelengths (greater than 3 $\mu$m), of being able to be integrated with semiconductor technology, and being able to provide, as far as the detectors are concerned, a very high impedance at ambient temperature (low dark current).

It is clearly evident that the aforegoing description has been given only by way of example. Other variants may be envisaged without departing from the scope of the invention. The numerical examples, in particular, have been provided only for the purpose of illustrating the description.

We claim:

1. A device for the detection of optical radiation comprising:

a substrate;

a first layer formed on the substrate and having a first conduction band edge energy;

an asymmetric quantum well consisting of:
a second layer formed on the first layer and having a second conduction band edge energy which is less than the first conduction band edge energy; and
a third layer formed on the second layer and having a third conduction band edge energy which is greater than the second conduction band edge energy and which is less than the first conduction band edge energy;
a fourth layer formed on the third layer and having a fourth conduction band edge energy equal to the first conduction band edge energy; and
wherein the respective conduction band edge energies of each layer have discrete values;

an FET the asymmetric quantum well contacting a source of the FET.

2. The device according to claim 1, wherein a thickness of each of the second and third layers is greater than 10 Å.

3. The device according to claim 1, wherein a doping density of p or n type dopants in at least one of the second or third layer is about $1 \cdot 10^{11}$ per $cm^2$.

4. The device according to claim 1, wherein a difference in energy between the second conduction band edge energy and third conduction band edge energy corresponds to electromagnetic radiation having a wavelength of about 10 microns.

5. The device according to claim 1, wherein the first and fourth layer are the same in composition.

* * * * *

UNITED STATES PATENT AND TRADEMARK OFFICE
CERTIFICATE OF CORRECTION

PATENT NO. : 5,869,844

DATED : February 9, 1999

INVENTOR(S): Emmanuel ROSENCHER et al.

It is certified that an error appears in the above-identified patent and that said Letters Patent is hereby corrected as shown below:

On the title page, item [30], the Foreign Application Priority Data, and item [63], Related U.S. Application Data should read:

--[30] Dec. 6, 1988 [FR] France ..................................................88 15956--

--[63] Continuation of Ser. No. 54,839, Apr. 30, 1993, abandoned, which is a continuation of Ser. No. 543,785, abandoned, which was filed as PCT/FR89/00253 on May 26, 1989.--

Signed and Sealed this

Eighteenth Day of January, 2000

Attest:

Q. TODD DICKINSON

*Attesting Officer*  *Commissioner of Patents and Trademarks*